United States Patent [19]

Boubouleix

[11] 4,092,613

[45] May 30, 1978

[54] TRANSISTORIZED CLASS AB POWER AMPLIFIER AND ITS BIAS CIRCUIT

[75] Inventor: Albert Boubouleix, Paris, France

[73] Assignee: Thomson-CSF, Paris, France

[21] Appl. No.: 785,787

[22] Filed: Apr. 8, 1977

[30] Foreign Application Priority Data

Apr. 13, 1976  France .................................. 76 10838

[51] Int. Cl.$^2$ .............................................. H03F 1/32
[52] U.S. Cl. .................................... 330/289; 330/296; 330/302
[58] Field of Search ................. 330/289, 294, 296, 302

[56] References Cited

U.S. PATENT DOCUMENTS 3,906,386  9/1975  Hongu et al. ........................... 330/22

Primary Examiner—Lawrence J. Dahl
Attorney, Agent, or Firm—Cushman, Darby & Cushman

[57] ABSTRACT

The bias circuit of the base of an HF amplifier transistor, arranged in a common-emitter configuration, comprises an LF transistor likewise in a common-emitter configuration and two resistors respectively connecting the base of the LF transistor to its collector and to a point of fixed potential. The bias voltage varies more rapidly, as a function of temperature, than the voltage across the terminals of the reference diode formed by the base-emitter junction of the LF transistor. This permits a correct temperature compensation of the HF transistor in spite of the temperature differences between the junctions of the HF and LF transistors and of the thermal inertia of the thermal link between these two transistors.

2 Claims, 1 Drawing Figure

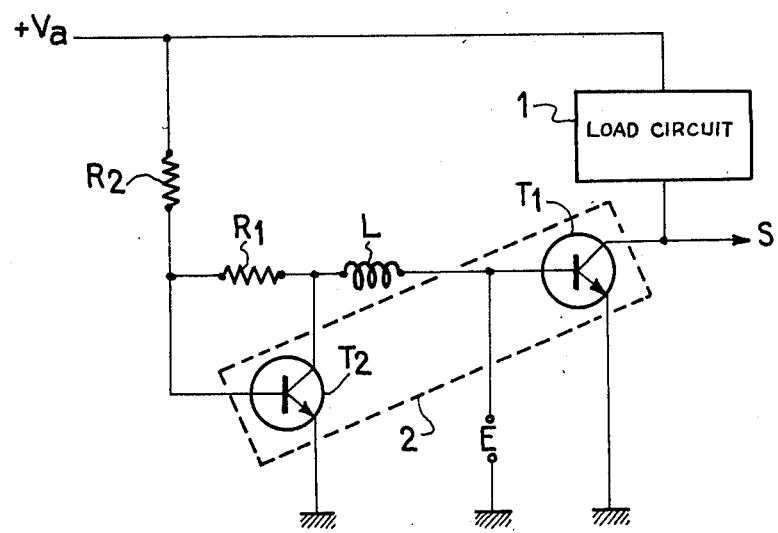

TRANSISTORIZED CLASS AB POWER AMPLIFIER AND ITS BIAS CIRCUIT

The present invention relates to a transistorised class AB power amplifier with automatic temperature compensation.

Amplifiers of this kind are known, which comprise a power transistor, designed to amplify an HF signal, and a base bias circuit for biasing the power transistor. In such amplifiers the base bias circuit is intended to adjust the base bias voltage on the power transistor so as to effect automatic temperature compensation and thus prevent any increase in the quiescent output current of the power transistor due to a rise in the temperature of the base-emitter junction of the power transistor.

To effect this knid of temperature compensation rapidly, the reference element, generally a diode or a transistor, is assembled inside the case of the power transistor itself. However, this is not essential as far as the power transistors used can cope with transients to which they are subjected in power amplifiers, and indeed more often then not power transistors contain no reference element within their case. It is worth noting, furthermore, that in circuits in which the reference element is located inside the case of the power transistor, in the situation where the reference element is defective, the whole case including the power transistor must be discarded and this in not an inconsiderable drawback.

In the known amplifiers where the reference element is outside the case of the power transistor, the base bias circuit of the latter exhibits at least one of the following drawbacks:
- a high cost since the circuitry involved is complex or requires delicate adjustment;
- excessive current drain on the supply source in relation to the quiescent current of the power transistor;
- mediocre temperature compensation;
- utilisation limited to certain kinds of power transistors.

The object of the present invention is to overcome these drawbacks while avoiding the need to employ a reference element arranged inside the case of the power transistor.

In accordance with the invention, there is provided a power amplifier comprising: an amplifier transistor designed to amplify an HF signal applied to its base, said amplifier transistor being connected in a common-emitter configuration at least as far as the bias is concerned, and having an emitter, a base and a collector, the latter being coupled to a fixed potential point; and a base bias circuit for biasing said amplifier transistor, said circuit comprising a regulating transistor arranged in a common-emitter configuration, and having an emitter, a base and a collector, the latter being coupled to the base of said amplifier transistor, and first and second resistors connecting the base of said regulating transistor respectively to its collector and to said fixed potential point.

The invention will be better understood and other of its features rendered apparent from a consideration of the ensuing description and the related FIGURE which is the diagram of an amplifier in accordance with the invention.

The FIGURE illustrates an HF amplifier operating in Class AB mode. This amplifier comprises an HF power transistor, $T_1$, of n-p-n type, in a common-emitter configuration. The signal input E of the amplifier is connected to the base of the transistor $T_1$ and the signal output S is connected to the collector of the transistor $T_1$. The collector of the transistor $T_1$ is connected to a constant supply voltage, $V_a$, across a load circuit 1.

The FIGURE also shows a bias circuit biasing the base of the transistor $T_1$; this circuit comprises:
- an LF transistor, $T_2$, of n-p-n type, in a common-emitter configuration, which performs the function of regulating transistor;
- a resistor $R_1$ connecting the base of the transistor $T_2$ to its collector;
- a resistor $R_2$ connecting the base of the transistor $T_2$ to the supply voltage, $V_a$;
- and an inductor L preventing the HF signal applied to the input E from reaching the bias circuit.

Such an amplifier has been designed with the following values:

$V_a = +6v,$ $R_1 = 10$ ohms, $R_2 = 0.2$ ohm.

The LF transistor, $T_2$, of the bias circuit should have a current gain sufficiently high (better than 30) to prevent it from becoming saturated at the low voltages at which it operates.

The resistor $R_2$ has a low value (0.2 ohm) so that the transistor $T_2$ is never saturated although its collector-emitter voltage $V_{ce}$ is lower than its base-emitter voltage $V_{be}$; this is due to the facts that the base electrode voltage $V_{be}$ is higher than the base junction voltage $V_{jb}$ on account of the internal resistance of the transistor $T_2$ and that it is possible to choose for the resistor $R_2$ a sufficiently low value to obtain:

$$V_{jb} < V_{ce} < V_{be}$$

The transistors $T_1$ and $T_2$ are assembled on the same heat sink unit 2, and (although this is not shown in the diagram) are as close as possible to one another in order to facilitate heat exchange between them.

Because the supply voltage is relatively high (+6V) in relation to the collector-emitter voltage of the transistor $T_2$ (which is of the order of 0.6V, with $R_1 = 0.2$ ohm and $R_2 = 10$ ohms), the transistor $T_2$ is supplied at constant current irrespective of temperature; since, furthermore, the transistor $T_2$ has a very high current gain, the constant current through the resistor $R_2$ (supply current to the transistor $T_2$) is virtually equal (to within 3% for a gain of 30) to the current through the resistor $R_1$ and, when the transistor $T_2$ is off load, to the current through the collector of this transistor; when the transistor $T_2$ is loaded by the power transistor $T_1$ (this is the case shown in the FIGURE) the current flowing through the resistors $R_1$ and $R_2$ keeps the same value but the value of the current through the collector of the transistor $T_2$ is reduced by the value of the bias current supplied to the base of the transistor $T_1$.

If we call $V_{be}$ the base-emitter voltage of the transistor $T_2$,
$V_{ce}$ the collector-emitter voltage of the transistor $T_2$,
$V_{bc}$ the base-collector voltage of the transistor $T_2$,
$I_c$ the collector current in the transistor $T_2$,
$I_o$ the constant current through the resistors $R_1$ and $R_2$, then for a given temperature value we have:

$$V_{be} > V_{ce}$$

$$V_{be} - V_{ce} = R_1 I_o = \text{constant}$$

and since, for temperatures for example of 25° C and 100° C $$V_{be} \text{ at } 25° C > V_{be} \text{ at } 100° C$$

and $$V_{ce} \text{ at } 25° C > V_{ce} \text{ at } 100° C$$

then $$(V_{ce} \text{ at } 25° C / V_{ce} \text{ at } 100° C) > (V_{be} \text{ at } 25° C / V_{ce} \text{ at } 100° C)$$

which shows that $V_{ce}$ reduces proportionally faster than $V_{be}$ with rising temperature.

Thus, when the temperature rises, the bias voltage on the base of the power transistor $T_1$ reduces and this of course effectively produces temperature compensation. But in this circuit, in contrast with the majority of circuits employed to effect temperature compensation of the base-emitter voltage of an HF power transistor, the bias voltage does not vary linearly as a function of the variation in a voltage appearing across the terminals of a diode or an element connected in order to behave as a diode; in the case of the circuit shown in the FIGURE the bias voltage varies more rapidly, as a function of temperature, than the voltage across the terminals of a diode since, for example, it has been seen that $$(V_{ce} \text{ at } 25° C / V_{ce} \text{ at } 100° C) > (V_{be} \text{ at } 25° C / V_{ce} \text{ at } 100° C)$$

and this is one of the advantages of the circuit; indeed, because of the temperature differences between the junctions of the transistors $T_1$ and $T_2$ (of the order of 80° at a maximum) and because of the thermal inertia of the thermal link between these two transistors, it is of interest to effect a compensation which instead of being a linear function of the voltage across the terminals of a reference junction, varies faster than this latter as the temperature rises, that is to say it is of interest to carry out what may be called "over-compensation".

In order to best adjust the compensating function it is possible:
- to choose the characteristic of the transistor $T_2$ appropriately;
- to adjust the resistance of $R_2$ as a function of a desired value of the collector-emitter voltage on the transistor $T_2$;
- to adjust the resistance of $R_1$ as a function of the desired amount of "over-compensation".

It may be thought that in the case of the transistor $T_2$ there will be major variations in the voltage $V_{be}$ from one sample to the next, and consequently in the voltage $V_{ce}$, as a function of the values of the current gain B of these samples. However, this is not so; indeed, taking the notation already used and calling:

$I_b$ the current flowing through the base of the transistor $T_2$, $R_b$ the base-emitter internal resistance of the transistor $T_2$, then:

$$R_b = K \cdot B$$

where K is a coefficient which depends upon the type of transistor $T_2$ used and upon the supply current to this transistor $$I_b = (V_{be}/R_b) = (V_{be}/K \cdot B)$$

and $$I_c = B \cdot I_b = (B \cdot V_{be}/K \cdot B) = (V_{be}/K)$$

this shows that $V_{be}$ is independent of B.

Measurements carried out upon fifteen LF transistors whose current gain B ranged from 24 in the case of the lowest to 75 in the case of the highest, have shown that with a collector current of 1 ampere the voltage $V_{be}$ ranged between 0.80 and 0.86 volts.

It is possible to conceive variant embodiments of the power amplifier in accordance with the invention; thus, the HF circuit 1 shown in the FIGURE, instead of being connected to the collector of the transistor $T_1$ could be connected to its emitter but the transistor $T_1$ would still have to be in a common-emitter arrangement as far as the bias is concerned.

Of course, the invention is not limited to the embodiments described and shown which were given solely by way of example.

What is claimed, is:

1. A class AB power amplifier comprising: an amplifier transistor designed to amplify an HF signal applied to its base, said amplifier transistor being connected in a common-emitter configuration at least as far as the bias is concerned, and having an emitter, a base and a collector, the latter being coupled to a fixed potential point; and a base bias circuit for biasing said amplifier transistor, said circuit comprising a regulating transistor arranged in a common-emitter configuration, and having an emitter, a base and a collector, the latter being coupled to the base of said amplifier transistor, and first and second resistors connecting the base of said regulating transistor respectively to its collector and to said fixed potential point.

2. A class AB power amplifier as claimed in claim 1, wherein said amplifier transistor and said regulating transistor are assembled on one and the same heat sink.

* * * * *